United States Patent

Nakagawa

[11] Patent Number: 5,825,251
[45] Date of Patent: Oct. 20, 1998

[54] AUDIO SIGNAL AMPLIFYING CIRCUIT

[75] Inventor: Eiji Nakagawa, Kyoto, Japan

[73] Assignee: Rohm Co., Ltd., Kyoto, Japan

[21] Appl. No.: 759,952

[22] Filed: Dec. 3, 1996

[30] Foreign Application Priority Data

Dec. 5, 1995 [JP] Japan .................................. 7-344581

[51] Int. Cl.$^6$ .............................. H03F 1/14; H04B 15/00
[52] U.S. Cl. ........................... 330/297; 381/94.5; 330/51
[58] Field of Search .............................. 330/51, 127, 149, 330/297; 381/120, 94.5

[56] References Cited

U.S. PATENT DOCUMENTS 4,433,306  2/1984  Honda et al. ............................ 330/297
5,703,528 12/1997  Nebuloni et al. ......................... 330/51

Primary Examiner—Steven Mottola
Attorney, Agent, or Firm—Fay, Sharpe, Beall, Fagan, Minnich & McKee

[57] ABSTRACT

An audio signal amplifying circuit includes a switch circuit disposed between a first power source line and a second power source line for bootstrapping, and a capacitor for bootstrapping disposed between the second power source line and a line to which an output terminal is connected. The switch circuit is controlled from ON to OFF upon receiving a muting signal, and is provided with a first switch circuit constituted by Darlington connected transistors having an NPN type transistor as the output stage thereof and a second switch circuit constituted by a PNP type transistor disposed in parallel with the NPN type transistor. The sum of the rated current values of the NPN type transistor in the first switch circuit and the rated current value of the PNP type transistor in the second switch circuit is selected to be equal to or more than the maximum supply current value for the second power source line, and the rated current of the PNP type transistor in the second switch circuit is selected to be smaller than the rated current values of the transistors in the first switch circuit.

7 Claims, 3 Drawing Sheets

(a) BOOTSTRAP VOLTAGE Vbs (b) OUTPUT VOLTAGE Vo

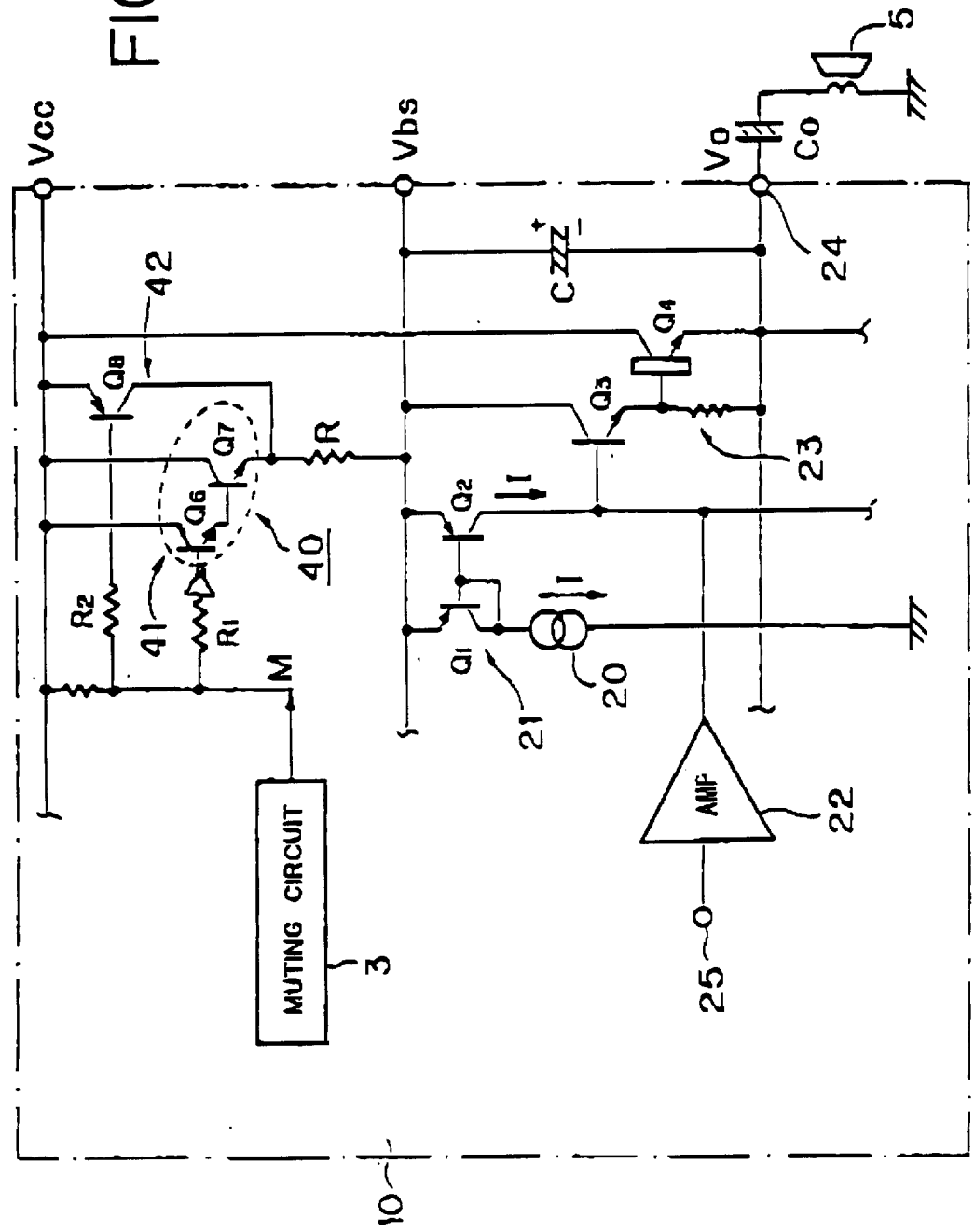

AUDIO SIGNAL AMPLIFYING CIRCUIT

BACKGROUND OF THE INVENTION

1. Field of the Invention

The present invention relates to an audio signal amplifying circuit and, more specifically, relates to an IC structured audio signal amplifying circuit of bootstrap type operating at a low voltage and used primarily for portable audio apparatus and for television receivers, video tape recorders (VTR, VCR) and the like which avoids the need to enlarge the occupying area of switch transistors for muting contained therein, and which can be driven at a further low voltage.

2. Background Art

An audio signal processing circuit using transistors and the like generates unpleasant abnormal sounds (so-called "pop" sounds and the like), when a power switch therein is turned "ON". Such abnormal sounds are generated because a signal caused when the power switch is turned "ON" is outputted via a power amplifier and, in the worst cases, may damage the speaker included therein. In order to avoide these inconveniences, a muting circuit is usually provided in the audio signal processing circuit so as to forcedly interrupt or ground the routing circuit for amplifying the audio signal until the power amplifier and the like reach a steady and stable condition.

In portable audio apparatus and the like an audio signal amplifying circuit which is driven with a low power source voltage is frequently used, therefore, a bootstrap circuit is included therein for preventing saturation of a drive stage in the amplifying circuit. In such an amplifying circuit, a switch circuit is provided between a bootstrap power source line and a power source line, and through ON/OFF control of the switch circuit the output stage of the amplifying circuit is rendered into a muting state to thereby countermeasure the pop sounds as mentioned above and the like.

A structure and operation of an audio signal amplifying circuit including a muting circuit which turns ON/OFF a muting switch are specifically explained with reference to a block diagram circuit shown in FIG. 3.

Numeral 1 is an audio signal amplifying circuit which is driven with a low power source voltage and the framed area indicated by dashed lines is normally structured into an IC. The audio signal amplifying circuit 1 includes an output circuit performing a push-pull operation with reference to Vcc/2 when assuming a power source voltage as Vcc. Numeral 2 is an output amplifier at the push side in the output circuit. The output circuit at the push side in the audio signal amplifying circuit 1 is primarily explained, in that, the output circuit at the push side further includes a muting circuit 3, an electrolytic capacitor C for bootstrapping, a resistor R, a switch circuit 4, an output capacitor Co, a speaker 5 and the like.

The output amplifier 2 is composed by a constant current source 20, a current mirror 21, an input stage amplifier 22 and an output stage amplifier 23, and the current mirror 21 and a driving transistor Q3 in the output stage amplifier 23 are connected to the bootstrap power source line Vbs and are supplied with electric power therefrom. In such an amplifying circuit the output stage is normally constituted by a push-pull circuit, however, in the drawing only the push side thereof is illustrated and illustration of the pull side thereof (a sink side circuit in the output amplifier 2) is omitted, because the pull side has no relation with respect to the connection of the bootstrap capacitor C.

The current mirror 21 is constituted by an input side transistor Q1 in diode connection and an output side transistor Q2, and the transistor Q1 is connected to the constant current source 20 and provides a current I. As a result, a current corresponding to the flow-out current I flows through the output side transistor Q2. The input stage amplifier 22 causes to sink a part of the flow-out current I in response to an input signal, whereby a drive signal (a current signal) corresponding to the input signal is transmitted to the base of the drive stage transistor Q3 in the output stage amplifier 23. An output stage transistor Q4 in the output stage amplifier 23 is driven when the base thereof receives the output current from the transistor Q3.

Numeral 24 is an output terminal to which the emitter of the transistor Q4 is connected, the output voltage thereat is identified as Vo and the voltage at the output terminal 24 when no signal is applied assumes Vcc/2. Further, the collector side of the transistor Q4 is connected to the power source line Vcc. The bootstrap capacitor C is provided between the output terminal 24 and the bootstrap power source line Vbs. Numeral 25 is an input terminal provided in the input stage amplifier 22 to which an audio signal from a pre-stage of the audio signal amplifying circuit 1 is supplied.

The switch circuit 4 is constituted by a PNP type transistor Q5 of which emitter is connected to the power source line Vcc and of which collector is connected via the resistor R to the bootstrap power source line Vbs, and when the base thereof receives a muting signal M of HIGH level from the muting circuit 3, the PNP type transistor Q5 is turned OFF and when no muting signal is received, in other words, no muting is effected, the muting signal M assumes LOW level to turn ON the switch circuit 4. The muting circuit 3 generates a muting signal M of HIGH level with a predetermined period when the power switch is turned "ON" or when the muting switch is operated via manual operation.

Herein the transistor Q5 in the switch circuit 4 has normally a current driving capability which permits a bootstrap operation of the amplifier circuit when performing a low voltage drive and is constituted by a PNP type transistor having a small collector-emitter saturation voltage Vsat. As a result, when such a circuit is constituted into an IC form, a problem is posed that the occupation area thereby is enlarged because of the increased current capacity.

In order to avoid above such a problem, an NPN type transistor in Darlington connection which permits vertical arrangement of respective regions for the collector, emitter and base thereof when structuring into an IC and further permits a large current flow with a comparatively small occupation area can be used for the switch circuit in place of the PNP type transistor Q5. However, when such an NPN type transistor is used, a voltage -drop corresponding to the base-emitter forward direction voltage drop 1 Vf of the transistor is induced with respect to the power source voltage, therefore, another problem which reduces the advantage of introducing the bootstrap circuit is posed that the power source voltage for the low voltage drive has to be raised by an amount corresponding to 1 Vf.

SUMMARY OF THE INVENTION

An object of the present invention is to provide an audio signal amplifying circuit which avoids the need to enlarge the occupation area of a switch transistor for muting when structuring the audio signal amplifing circuit into an IC.

Another object of the present invention is to provide an audio signal amplifying circuit including a switch transistor for muting and a bootstrap type output circuit which can be driven with a further lower voltage and is suitable for structuring into an IC.

An audio signal amplifying circuit according to the present invention which achieves the above objects and which includes a switch circuit disposed between a first power source line and a second power source line for bootstrapping and a capacitor for bootstrapping disposed between the second power source line and a line to which an output terminal is connected, wherein the switch circuit is controlled from ON to OFF upon receiving a muting signal, the switch circuit is provided with a first switch circuit constituted by an NPN type transistor in Darlington connection as the output stage thereof and a second switch circuit constituted by a PNP type transistor disposed in parallel with the NPN type transistor, wherein the sum of the rated current values of the NPN type transistor in the first switch circuit and the rated current value of the PNP type transistor in the second switch circuit is selected to be equal to or more than the maximum supply current value for the second power source line and the rated current of the PNP type transistor in the second switch circuit is selected to be smaller than the rated current values of the Darlington connected transistors in the first switch circuit.

Namely, as the switching circuit for muting which is disposed between the first power source line (hereinbelow, called the power source line Vcc) and the second power source line (hereinbelow, called the bootstrap power source line Vbs), two switch circuits each constituted by a transistor or transistors are disposed in parallel. Among the two switch circuits, a switch circuit constituted by the NPN type transistor in Darlington connection is named as the first switch circuit and a switch circuit constituted by the PNP type transistor which is connected in parallel with the first switch circuit is named as the second switch circuit. The sum of the rated current values of these transistors is selected equal to or more than the maximum supply current value for the bootstrap power source line Vbs. Further, the rated current value of the transistors in the first switch circuit is selected to be dominant and the rated current value of the PNP type transistor in the second switch circuit is selected to be smaller than the rated current value of the transistors in the first switch circuit to thereby reduce the area occupied thereby when structuring the same into an IC. The reason why the area occupied by the second switch circuit can be reduced is that the second switch circuit is required to be able to supply a current for bootstrapping to the bootstrap capacitor only when the potential difference between the bootstrap power source line Vbs and the power source line Vcc is below 1 Vf. Therefore, the current capacity required for such moment is limited.

Such current supply operation for bootstrapping is explained more specifically. In the above explained constitution, at first assuming that when the level of an output signal is under a lower half cycle, in other words, the output stage amplifier is performing a sinking operation, the first switch circuit is not turned ON until the amplitude of the output signal reduces from a reference potential and the potential difference between the bootstrap power source line Vbs and the power source line Vcc reduces to about 1 Vf. This is because the output stage transistor in Darlington connection constituting the first switch circuit is an NPN type transistor. However, at this moment, the second switch circuit is turned ON, because the second switch circuit is constituted by a PNP type transistor. Thereby, a driving current for the output stage transistor and a charging current for the bootstrap capacitor and the like are supplied from the second switch circuit. When the amplitude of the output signal further reduces from the reference potential, in other words, the potential difference between the bootstrap power source line Vbs and the power source line Vcc becomes more than 1 Vf, the NPN type transistor in the first switch circuit which permits to flow a further larger current is turned ON to supply the driving current and the charging current for the bootstrap capacitor and the like. At this moment, since a voltage which permits the amplifying circuit a bootstrap operation when the second switch circuit is turned ON is one having a voltage drop of about 0.2 V (which corresponds to Vsat of the PNP transistor) from the power source voltage Vcc, the supply of the driving current and the charging of the bootstrap capacitor can be effected even when the potential difference from the power source line Vcc is below 1 Vf. Thereby, the voltage of the power source can be set at a further lower voltage for the bootstrap type audio signal amplifying circuit.

As a result, an audio signal amplifying circuit is realized which permits a bootstrap operation even when the power source voltage is lowered. Further, an audio signal amplifying circuit is realized which is suitable for forming into a one-chip IC and has an equivalent function as the switch circuit using a PNP transistor for muting and of which occupying area is reduced in comparison with one when the PNP transistor is structured into an IC.

BRIEF DESCRIPTION OF THE DRAWINGS

FIG. 4 is a block diagram of another embodiment of an audio signal amplifying circuit according to the present invention.

DESCRIPTION OF THE PREFERRED EMBODIMENT

Figure 1:
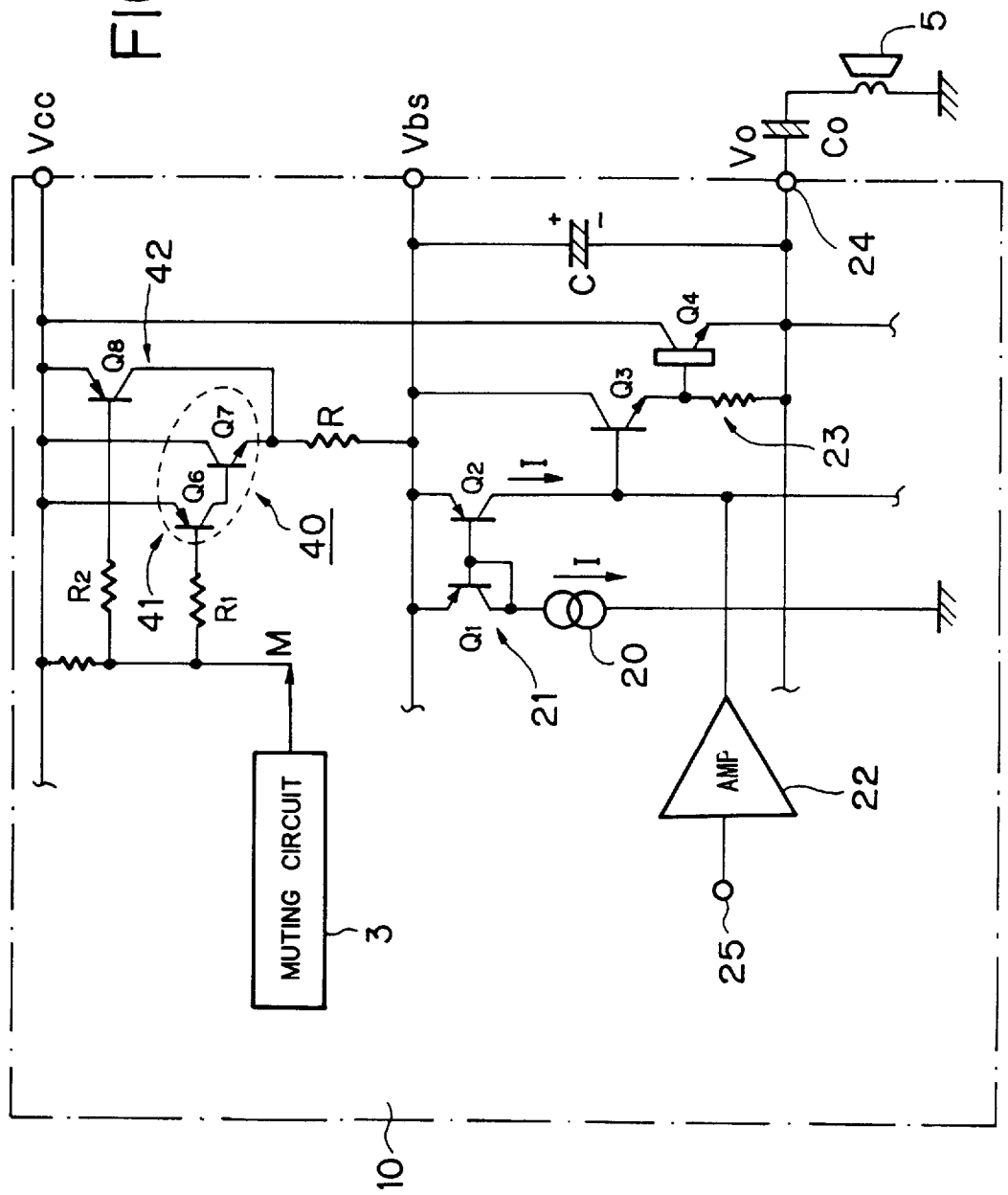
FIG. 1 is a block diagram of one embodiment of an audio signal amplifying circuit according to the present invention.
Figure 2:
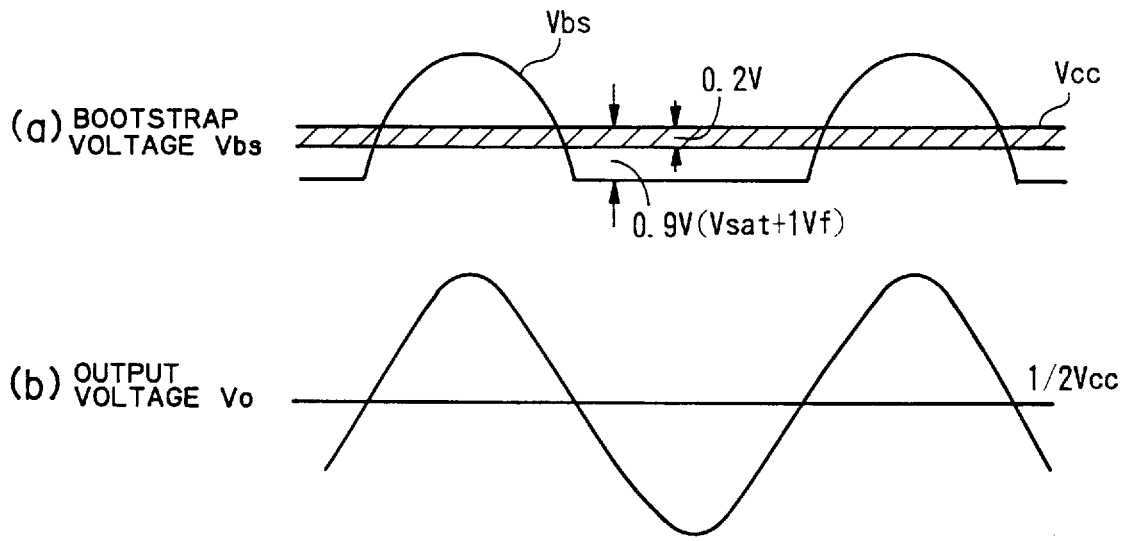
FIG. 2 is a view for explaining a relationship between bootstrap voltage and output signal voltage in the embodiment of FIG. 1.
Figure 3:
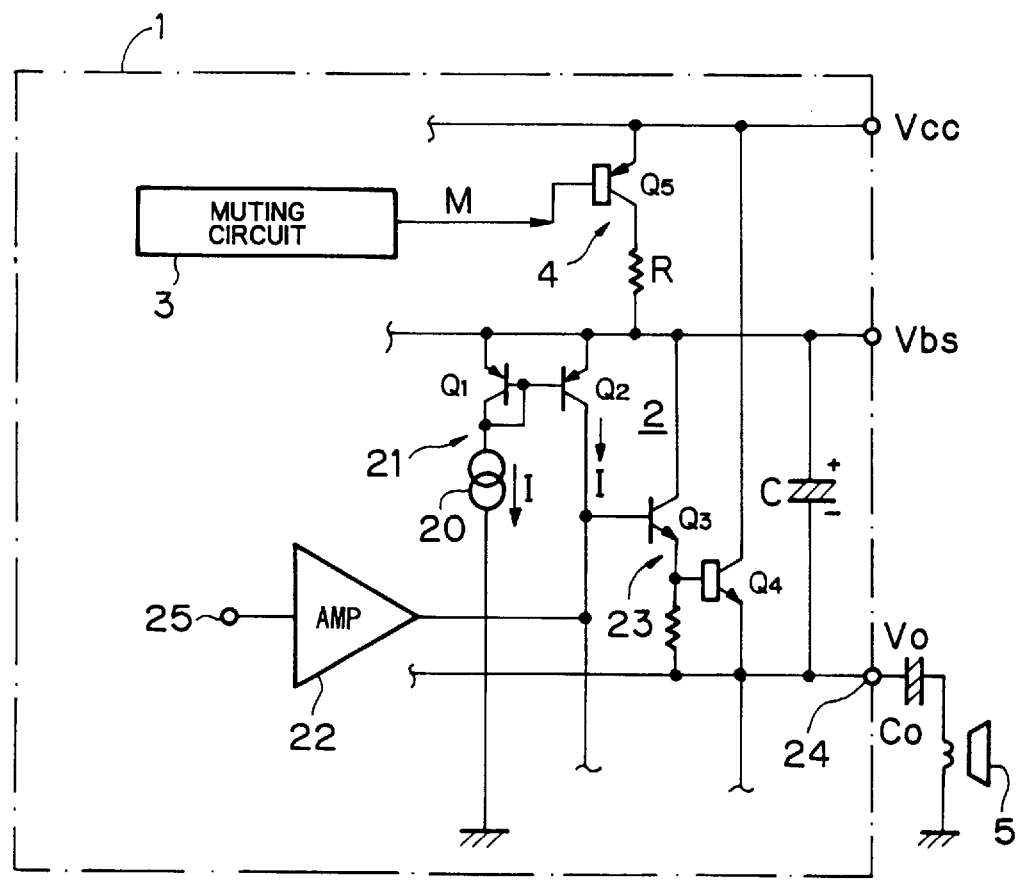
FIG. 3 is a block diagram of a conventional audio signal amplifying circuit.

In an audio signal amplifying circuit 10 shown in FIG. 1, a switch circuit 40 is provided in place of the switch circuit 4 as shown in FIG. 3 and is formed into a one-chip IC. Other constitutions in the audio signal ampifying circuit 10 are substantially the same as those in FIG. 3. Namely, the audio signal amplifying circuit 10 includes an output circuit which performs a push-pull operation with reference to Vcc/2 when assuming the power source voltage as Vcc. Further, the voltage at the output terminal 24 assumes Vcc/2 when no signal is applied. Therefore, the voltage waveform of the output signal appears as illustrated in FIG. 2(b).

The switch circuit 40 is constituted by a first switch circuit 41 which includes transistors in Darlington connection having a PNP type transistor Q6 at the input side (input stage) and an NPN type transistor Q7 at the output side (output stage), and a second switch circuit 42 which includes a PNP transistor Q8, in place of the transistor Q5 as shown in FIG. 3.

When the base of the PNP type transistor Q6 receives a muting signal M of HIGH level with a predetermined period from the muting circuit 3 via a resistor R1, the PNP type transistor Q6 is turned OFF, and at this moment the NPN type transistor Q7 is also turned OFF. The emitter of the PNP type transistor Q6 is connected to the power source line Vcc and the collector thereof is connected to the base of the NPN type transistor Q7. The collector of the NPN type transistor Q7 is connected to the power source line Vcc and the emitter thereof is connected to the bootstrap power source line Vbs via the resistor R. Therefore, even when the PNP type transistor Q6 is in the ON state corresponding to no muting signal application, the NPN type transistor Q7 is never turned ON until the potential of the emitter of the NPN type transistor Q7 rises more than 1 Vf with respect to the base thereof. Namely, the NPN type transistor Q7 is turned ON when the potential difference between the power source line Vcc and the bootstrap power source line Vbs exceeds 1 Vf.

The PNP type transistor Q8 is turned OFF when a muting signal M is received from the muting circuit 3 via a resistor R2, the emitter thereof is connected to the power source line Vcc, and the collector thereof is connected to the junction between the resistor R and the emitter of the NPN type transistor Q7, whereby the PNP type transistor Q8 is connected in parallel with the switch circuit 41.

The capacity of the PNP type transistor Q8 is extremely small in comparison with that of the conventional PNP type transistor Q5 as shown in FIG. 3 and supplies a necessary current for the bootstrap power source line Vbs during the time in which no signal is applied and until the potential difference between the bootstrap power source line Vbs and the power source line Vcc drops to about 1 Vf during the time in which the amplitude of the output signal at the output stage assumes the lower half cycle. Therefore, the rated current of the PNP type transistor Q8 is determined to an amount simply enough to ensure the driving current and the charging current for the bootstrap capacitor C required at this moment.

On the other hand, the sum of the rated current values supplied from the Darlington connected transistors constituted by the transistors Q6 and Q7 and from the transistor Q8 is determined to be equal to or more than an amount which can supply the maximum current so as to permit the signal amplifying circuit to operate as a bootstrap circuit during the time in which the amplitude of the output signal at the output stage assumes the lower half cycle as well as sufficiently charges the bootstrap capacitor C. On this principle, the rated current values of the Darlington connected transistors constituted by the transistors Q6 and Q7 are selected. Accordingly, the current which permits the audio signal amplifying circuit to operate as a bootstrap circuit is primarily supplied from the Darlington connected transistors (the switch circuit 41) constituted by the transistors Q6 and Q7.

For this reason, the respective resistance values of the biasing resistor R1 for the Darlington connected transistors, the biasing resistor R2 for flowing the driving current for the transistor Q8, and the resistor R are selected so that the maximum currents which flow through the respective transistors Q6, Q7 and Q8 when the same are in the ON state are equal to or less than the rated current values of the respective transistors.

In such a circuit, when a very small signal is applied, such that no audio signal or a very small signal is inputted to the input terminal 25 from a pre-stage, the transistor Q8 (the switch circuit 42) is turned ON and a current is supplied to the bootstrap capacitor C via the transistor Q8. Further, a driving current of the order of an idling current is also supplied to driving circuits such as the current mirror 21 and the transistor Q3 via the transistor Q8. Since no large current is required during no signal application, a transistor having a small rated current value is acceptable for the transistor Q8. Therefore, it is satisfactory if the rated current value of the transistor Q8 is equal to or more than the maximum current value which flows through the audio signal amplifying circuit before the transistors Q6 and Q7 in Darlington connection are turned ON.

On the other hand, when a signal without a very small signal exists, such that an audio signal is inputted at the input terminal 25, a signal which drives the output stage is generated. During a bootstrap operation and when the amplitude of the output voltage $V_O$ assumes the lower half cycle (during the pull operation of the output stage circuit), the bootstrap capacitor C is charged as well as the output transistor Q4 is supplied with a driving current. In this instance, during the time in which the voltage at the output terminal 24 is under the lower half cycle and until the voltage of the bootstrap power source line Vbs drops by about 1 Vf with respect to the power source line Vcc, the currents are supplied to the respective circuits and the bootstrap capacitor C only from the transistor Q8. In this instance, even when the current supply capacity of the transistor Q8 becomes short, the voltage of the bootstrap power source line Vbs drops, whereby the operation of the switch circuit 41 is prevented.

During the lower half cycle and when the voltage at the output terminal 24 further reduces from a reference potential (=Vcc/2) and the voltage of the bootstrap power source line Vbs with respect to the power source line Vcc drops by about or more than 1 Vf, the Darlington connected transistors constituted by the transistors Q6 and Q7 are rendered into the ON state, and supply the driving currents and the charging current for the bootstrap capacitor C together with the transistor Q8.

Further, when the output voltage signal $V_O$ assumes the upper half cycle, an electric power is supplied to the respective circuits and a signal having an amplitude exceeding the power source line Vcc at the maximum by an amount corresponding to the charged voltage of the bootstrap capacitor C is generated as a drive signal to drive the output stage transistor Q4.

As a result, the voltage of the bootstrap power source line Vbs with respect to the output voltage $V_O$ at the output terminal 24 as shown in FIG. 2(b) varies as shown in FIG. 2(a). In this instance, under the lower half cycle of the output signal and from around the moment when the potential difference with respect to the power source line Vcc assumes about 0.2 V (=Vsat) as indicated by hatching, the driving current and the current for bootstrapping are supplied respectively to the driving circuit and the bootstrap capacitor C. After exceeding the hatched area in FIG. 2(a), only the transistor Q8 is conductive and through which currents for the respective circuits and the bootstrap capacitor C are supplied and the voltage range thereof is 0.2~0.9 V. Further, under the lower straight line portion in the waveform of the bootstrap power source voltage Vbs the Darlington connected transistors (the switch circuit 41) are placed in the ON state, primarily the transistors Q6 and Q7 together with the transistor Q8 supply the driving current and the charging current for the bootstrap capacitor C. Such a range corresponds to the voltage below the power source voltage Vcc by about 0.9 V(=1 Vf+Vsat=0.7 V+0.2 V). The respective voltage values in the present embodiment are merely indicated for the sake of convenient explanation and the voltage drop due to the resistor R is not taken into account.

Now, during the upper half cycle of the output voltage signal $V_O$, the first and the second switch circuits (transistors Q6, Q7 and Q8) 41 and 42 are prevented from supplying a current to the bootstrap power source line Vbs. At this moment, the currents for the drive circuits such as transistors Q1, Q2 and Q3 are supplied through discharging of the charged boostrap capacitor C and the corresponding discharged current from the bootstrap capacitor C is again charged during the subsequent lower half cycle.

On the other hand, the output current of the output stage which is outputted from the output transistor Q4 is supplied to the power source line Vcc. For this reason, the current supplied from the bootstrap capacitor C is primarily a current for the driving current, therefore, no large current is required.

In the present embodiment thus explained above, the input stage of the Darlington connected transistors is constituted by a PNP type transistor, to operate both switch circuits in response to a common muting signal. However, if an input stage NPN type transistor is used for the Darlington connected transistors, it is sufficient if an inverted muting signal is inputted to the base of the NPN type transistor, as shown in FIG. 4. Therefore, the Darlington connected transistors are not limited to those disclosed in the above embodiment.

I claim:

1. An audio signal amplifying circuit comprising:

a switch circuit disposed between a first power source line and a second power source line for bootstrapping; and a capacitor for bootstrapping disposed between said second power source line and a line to which an output terminal is connected, wherein said switch circuit is controlled from ON to OFF upon receiving a muting signal, said switch circuit is provided with a first switch circuit constituted by Darlington connected transistors having an NPN type transistor as the output stage thereof and a second switch circuit constituted by a PNP type transistor disposed in parallel with said NPN type transistor, the sum of the rated current values of said NPN type transistor in said first switch circuit and the rated current value of said PNP type transistor in said second switch circuit is selected to be equal to or more than the maximum supply current value for said second power source line, and the rated current value of said PNP type transistor in said second switch circuit is selected to be smaller than the rated current values of said transistors in said first switch circuit.

2. An audio signal amplifying circuit according to claim 1, wherein during a time in which no muting signal is received, said first switch circuit is turned ON when the potential difference between said first power source line and said second power source line becomes equal to or more than the base-emitter forward direction voltage drop of said NPN type transistor.

3. An audio signal amplifying circuit according to claim 2, wherein said first switch circuit and said second switch circuit are connected to said second power source line via a common resistor, and the rated current value of said transistor for said second switch circuit is set equal to or more than the maximum current value which flows until said first switch circuit is turned ON.

4. An audio signal amplifying circuit according to claim 3, wherein the input stage of said Darlington connected transistors is a PNP type transistor and the muting signal is inputted to the base of said input stage PNP type transistor for said first switch circuit and the base of said PNP type transistor for said second switch circuit.

5. An audio signal amplifying circuit according to claim 3, wherein the input stage of said Darlington connected transistors is an NPN type transistor, an inverted signal of the muting signal is inputted to the base of said input stage NPN type transistor for the first switch circuit and the muting signal is inputted to the base of the PNP type transistor for the second switch circuit.

6. An audio signal amplifying circuit according to claim 4, further comprising a push-pull output circuit, wherein a driving circuit for a push side output transistor in said push-pull output circuit is connected to said second power source line and is supplied with a driving current from said capacitor for bootstrapping, and said push side output transistor is connected to said first power source line.

7. An audio signal amplifying circuit according to claim 6, further comprising a muting circuit which generates the muting signal of HIGH level with a predetermined period when a power source switch is turned ON, wherein said input stage transistor in said Darlington connected transistors is connected to said muting circuit via a first resistor and the base of said transistor for said second switch circuit is connected to said muting circuit via a second resistor.

* * * * *